United States Patent
Kim et al.

(10) Patent No.: US 7,812,654 B2
(45) Date of Patent: Oct. 12, 2010

(54) DELAY LOCKED LOOP CIRCUITS AND METHOD FOR CONTROLLING THE SAME

(75) Inventors: Jun-Bac Kim, Seoul (KR); Chang-Hyung Bae, Daegu (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 161 days.

(21) Appl. No.: 11/969,434

(22) Filed: Jan. 4, 2008

(65) Prior Publication Data

US 2008/0169852 A1    Jul. 17, 2008

(30) Foreign Application Priority Data

Jan. 11, 2007    (KR) ............... 10-2007-0003122

(51) Int. Cl.
*H03L 7/06* (2006.01)
(52) U.S. Cl. .................. 327/158; 327/149; 327/161
(58) Field of Classification Search .......... 327/149, 327/153, 158, 161
See application file for complete search history.

(56) References Cited

U.S. PATENT DOCUMENTS

| | | | |
|---|---|---|---|
| 6,573,771 B2 | 6/2003 | Lee et al. | |
| 6,580,304 B1* | 6/2003 | Rieven | 327/276 |
| 6,628,154 B2* | 9/2003 | Fiscus | 327/158 |
| 6,982,578 B2 | 1/2006 | Lee | |
| 7,072,433 B2* | 7/2006 | Bell | 375/376 |
| 7,525,354 B2* | 4/2009 | Gomm et al. | 327/158 |
| 2002/0079937 A1* | 6/2002 | Xanthopoulos | 327/158 |
| 2006/0038597 A1 | 2/2006 | Becker et al. | |
| 2006/0152260 A1 | 7/2006 | Chung | |
| 2006/0170471 A1 | 8/2006 | Haerle et al. | |
| 2006/0176096 A1* | 8/2006 | Dreps et al. | 327/262 |
| 2008/0100356 A1* | 5/2008 | Lee | 327/158 |

* cited by examiner

*Primary Examiner*—Lincoln Donovan
*Assistant Examiner*—Patrick O'Neill
(74) *Attorney, Agent, or Firm*—F. Chau & Associates, LLC

(57) ABSTRACT

A delay locked loop circuit and a method for controlling the same including a delay locked loop (DLL) circuit for receiving an external clock signal and generating an internal clock signal synchronized to the external clock signal includes at least two delay chains having different types of delay cells for delaying the external clock signal. Thus, the layout area and power consumption can be reduced, and logic failures can be prevented or minimized by replacement or compensation of the main delay cells.

12 Claims, 5 Drawing Sheets

DELAY LOCKED LOOP CIRCUITS AND METHOD FOR CONTROLLING THE SAME

CROSS-REFERENCE TO RELATED APPLICATION

This application claims the benefit of Korean Patent Application No. 10-2007-0003122, filed Jan. 11, 2007, the disclosure of which is hereby incorporated herein by reference in its entirety.

BACKGROUND OF THE INVENTION

1. Technical Field

The present disclosure relates to a delay locked loop circuit and a method for controlling the same and, more particularly, to a delay locked loop circuit and a method for controlling the same that are capable of compensating for delay according to voltage variations.

2. Discussion of Related Art

With the rapid development of semiconductor technology, digital systems such as personal computers, personal digital assistants (PDAs), and portable communication devices have been advanced in capabilities over the past several years. The operational speed and data transmission rate of peripheral devices, such as memories, communication devices, or graphic devices have also been improved. Because the operational speed of the peripheral devices cannot keep pace with operation speed of microprocessors, however, there is always a speed difference between new microprocessors and their corresponding peripheral devices. Accordingly, high-speed peripheral devices have been required for a high-performance digital system.

For example, in an input/output system in which data transmission is performed in synchronization with a clock signal, as in data transmission between a memory device and a memory controller, temporal synchronization between the clock signal and the data is very important as the load on a bus increases and the transmission frequency becomes higher. To achieve the necessary temporal synchronization, a phase locked loop (PLL) circuit and a delay locked loop (DLL) circuit may be used.

In general, the delay locked loop (DLL) is used to synchronize an internal clock of a synchronous memory to an external clock. That is, the delay locked loop (DLL) is used to synchronize the internal clock to the external clock when a delay time is generated upon using the external clock inside the memory.

FIG. 1 is a block diagram illustrating a conventional delay locked loop circuit.

Referring to FIG. 1, the conventional delay locked loop circuit comprises a delay chain 10, a phase interpolator (PI) 20, a phase selection and control unit 30, a phase detector (PD) 40, and a replica path (RP) 50.

The delay chain 10 comprises a plurality of delay cells (D). The delay chain 10 delays an external clock signal ECLK, which is a reference clock input from an external device, by a predetermined time and outputs a delayed clock signal. A delay amount of the delay chain 10 is controlled by the phase selection and control unit 30 according to a phase difference between the external clock signal ECLK and a clock signal fed back via the replica path 50.

The phase interpolator 20 properly controls two clock signals with different phases to generate a clock signal with a phase between the two clock signal phases. An interpolation circuit is used in a variety of application circuits because of its capability of outputting a precise desired phase. The phase interpolator 20 interpolates the clock signal output from the delay chain 10 to generate a clock signal with a suitable phase.

The replica path 50 is a circuit having the same delay condition as an actual clock path, such as a 'tSAC path' 60, for delivering the clock signal from the phase interpolator 20 to a final data output terminal of the semiconductor memory device (not shown). The replica path 50 is also called a replica circuit. The clock signal replicated and fed back by the replica path 50 has the same phase as the clock signal delivered to the final data output terminal of the semiconductor memory device (not shown).

The phase detector 40 compares the phase of the external clock signal ECLK with the phase of the clock signal fed back from the replica path 50 and outputs the comparison result to the phase selection and control unit 30.

The phase selection and control unit 30 determines whether to increase or decrease the delay amount of the delay chain 10, based on the comparison result from the phase detector 40, and adjusts the delay amount of the delay chain 10 according to the determination result.

In this manner, the delay locked loop circuit locks the clock signal on the final data input/output terminal of the memory device to be synchronized to the external clock signal ECLK. That is, the delay time generated in the course of delaying the clock signal using the delay locked loop circuit and delivering it to the final data input/output terminal is replicated and fed back by the replica path 50. Thus, the delayed clock signal is locked by controlling the delay amount of the delay chain 10 according to the phase difference detected between the external clock signal ECLK and the fed back clock signal, so that the clock signal used in the final data input/output terminal is synchronized to the external clock signal ECLK.

In this conventional delay locked loop circuit, delay amounts of the actual clock path, that is, the tSAC path 60, and the replica path 50 vary with variations of an operation voltage. In this case, a logic failure may occur due to insufficient delay cells of the delay chain 10.

This phenomenon may occur when an operation voltage is unstable or when a test is performed with a changing operation voltage. In general, as the operation voltage changes from a low level to a high level, the delay in the replica path 30 decreases. This is compensated by increasing the number of delay cells in the delay chain 10 of the delay locked loop circuit. When the operation voltage changes from a high level to a low level, the delay of the replica path 30 increases. This is compensated by decreasing the number of the delay cells. When the change in the operation voltage is too great to compensate for, through an increase or decrease in the number of delay cells in the delay chain 10, the logic failure occurs.

To prevent or minimize such a logic failure, sufficient delay cells of the delay chain 10 are required. That is, when the operation voltage changes from a low level to a high level, the number of selectable delay cells must be sufficient. When the operation voltage changes from the high level to the low level, a number of selectable delay cells must be required to reduce a delay time.

Increasing the number of the delay cells, however, increases layout area and power consumption. Accordingly, there is a need for a technique of preventing and minimizing logic failure, while minimizing the layout area and power consumption.

SUMMARY OF THE INVENTION

Exemplary embodiments of the present invention provide a delay locked loop circuit and a method for controlling the same that are capable of solving the aforementioned problems.

An exemplary embodiment of the present invention provides a delay locked loop circuit and a method for controlling the same that are capable of preventing or minimizing logic failures.

An exemplary embodiment of the present invention provides a delay locked loop circuit and a method for controlling the same that are capable of minimizing a layout area.

According to an exemplary embodiment of the present invention, a delay locked loop circuit and a method for controlling the same are provided that are capable of minimizing power consumption.

Exemplary embodiments of the present invention provide a delay locked loop (DLL) circuit for receiving an external clock signal and generating an internal clock signal synchronized to the external clock signal, the circuit comprising at least two delay chains having different types of delay cells for delaying the external clock signal either directly or indirectly.

One of the delay chains may comprise a plurality of main delay cells of a differential amplifier type, and the other may comprise a plurality of additional delay cells of an inverter or buffer type.

Exemplary embodiments of the present invention provide a delay locked loop (DLL) circuit for receiving an external clock signal and generating an internal clock signal synchronized to the external clock signal, the circuit comprising: a main delay chain including a plurality of main delay cells for delaying the external clock signal and outputting a first clock signal; a phase interpolator for interpolating the first clock signal received from the main delay chain and outputting a second clock signal; an additional delay chain for additionally adjusting the second clock signal output from the phase interpolator and outputting a third clock signal; a replica path for delaying the third clock signal output from the additional delay chain by a predetermined time according to a delay condition and outputting a fourth clock signal, the delay condition being the same as that of an actual delay path; a phase detector for comparing a phase of the external clock signal with a phase of the fourth clock signal output from the replica path and outputting a detection signal corresponding to the comparison result; and a phase selection and control unit for controlling a delay amount of the main delay chain and selecting the delay cells in response to the detection signal output from the phase detector.

The additional delay chain may have an inverter chain structure or a buffer chain structure. The circuit may further comprise an additional delay chain control unit for controlling a delay amount of the additional delay chain. The circuit may further comprise a delay sensing unit for sensing use information of the main delay cells in the main delay chain. The delay sensing unit may receive the detection signal from the phase detector and a main delay cell selection information signal from the phase selection and control unit to generate a sense signal corresponding to the use information of the main delay cells in the main delay chain.

The additional delay chain control unit may control the additional delay chain in response to the sense signal from the delay sensing unit. The delay locked loop circuit may perform an update operation in response to a column address strobe (CAS) before a row address strobe (EAS) (CBR) refresh signal.

Exemplary embodiments of the present invention provide a method for controlling a delay locked loop circuit comprising at least two delay chains, the method comprising: when one of the delay chains does not provide a sufficient delay amount or is to be replaced, additionally controlling a delay amount using the other delay chain.

The delay chains may comprise a main delay chain and an additional delay chain, and the main delay chain and the additional delay chain may comprise different types of delay cells. The main delay chain may comprise a plurality of main delay cells of a differential amplifier type, and the additional delay chain may comprise a plurality of additional delay cells of an inverter or buffer type.

The delay locked loop circuit may perform update operation in response to a CBR refresh signal. The additional delay chain may have an inverter chain structure or a buffer chain structure.

With the above configuration, the layout area and power consumption can be reduced, and logic failures can be prevented or minimized by replacement or compensation of the main delay cells.

Exemplary embodiments of the present invention will now be described more fully hereinafter with reference to the accompanying drawings, in which exemplary embodiments of the invention are shown. This invention may, however, be embodied in many different forms and should not be construed as being limited to the exemplary embodiments set forth herein. Rather, these embodiments are provided so that this disclosure will be thorough and complete, and will fully convey the scope of the invention to those of ordinary skill in the art.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. The present invention may, however, be embodied in different forms and should not be construed as limited to the exemplary embodiments set forth herein. Rather, these exemplary embodiments are provided as teaching examples of the present invention. Like numbers refer to like elements throughout the drawings.

Figure 1:
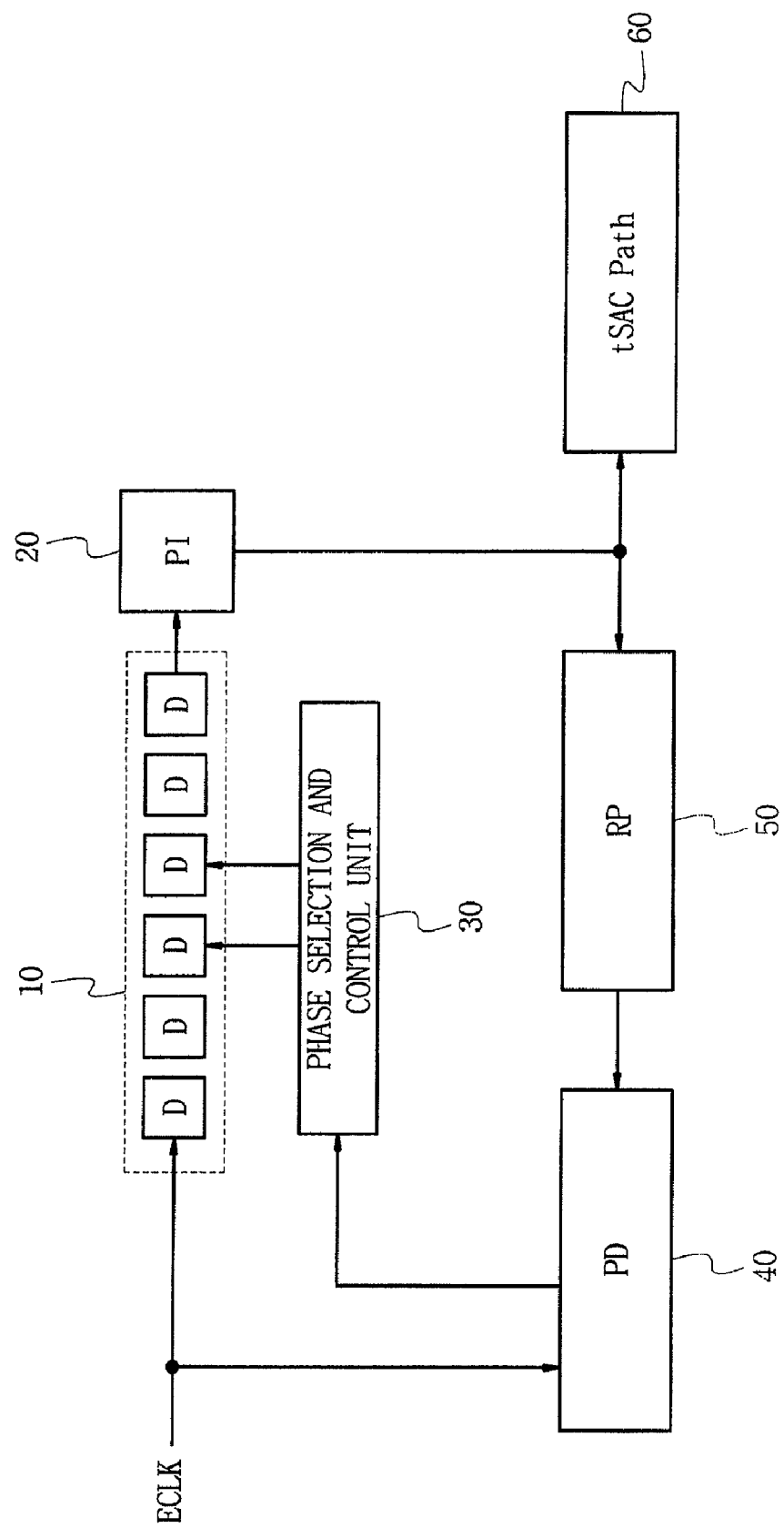
FIG. 1 is a block diagram illustrating a conventional delay locked loop circuit.
Figure 2:
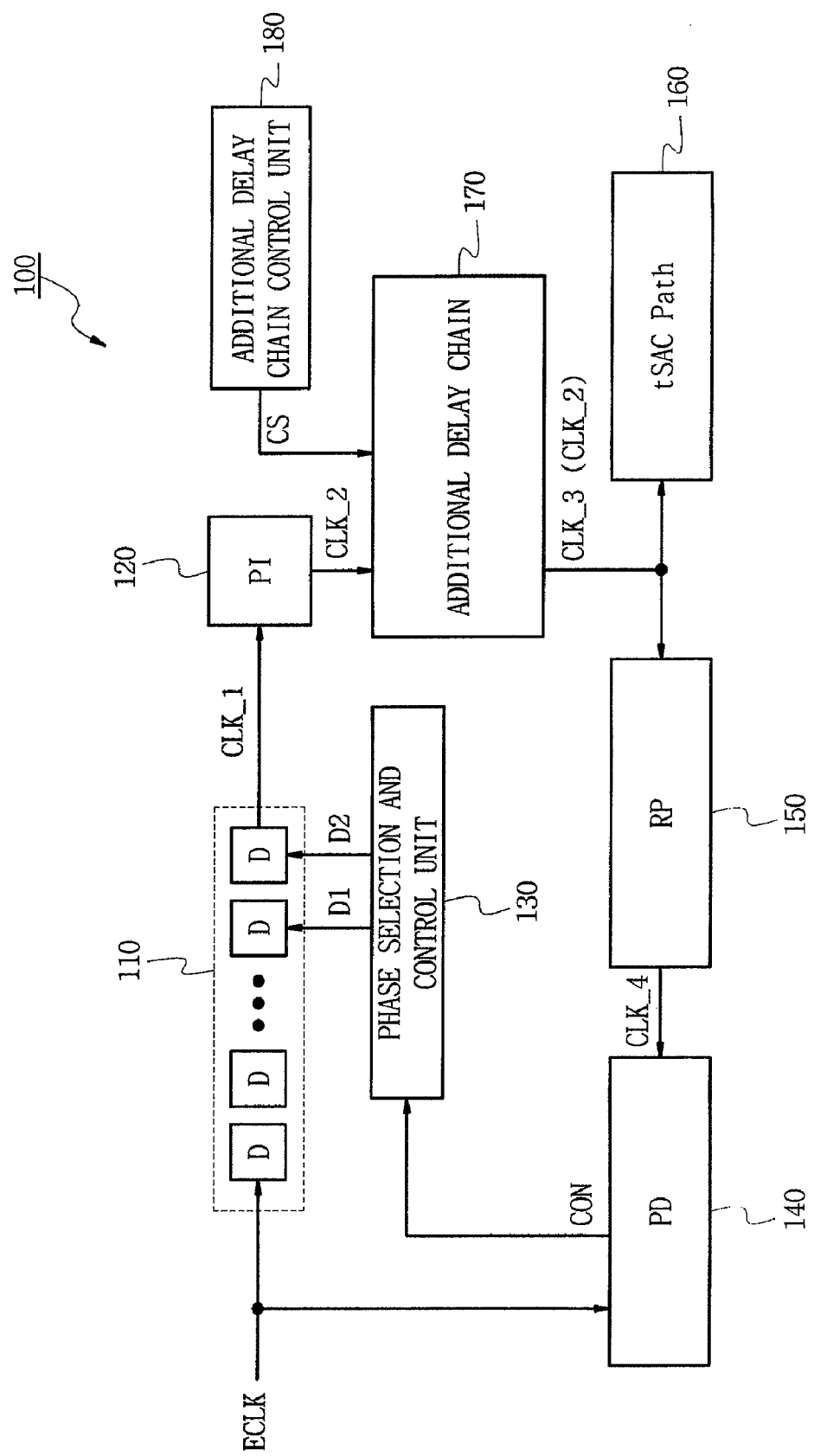
FIG. 2 is a block diagram illustrating a delay locked loop circuit according to an exemplary embodiment of the present invention.

FIG. 2 is a block diagram illustrating a delay locked loop circuit 100 according to an exemplary embodiment of the present invention.

Referring to FIG. 2, the delay locked loop circuit 100 according to an exemplary embodiment of the present invention comprises a main delay chain 110, a phase interpolator (PI) 120, a phase selection and control unit 130, a phase detector (PD) 140, a replica path (RP) 150, and an additional delay chain 170. The delay locked loop circuit 100 may further comprise an additional delay chain control unit 180 for controlling the additional delay chain 170 or/and a duty cycle correction (DCC) circuit (not shown) for correcting an output signal of the phase interpolator 120 so as to have a predetermined duty cycle, for example, 50%.

The main delay chain 10 comprises a plurality of main delay cells (D). The main delay chain 10 delays an external clock signal ECLK input from an external device by a predetermined time and outputs a delayed clock signal. That is, the main delay chain 10 delays the external clock signal ECLK using the plurality of main delay cells (D) and makes available a plurality of reference clock signals. In this exemplary embodiment, each main delay cell has a delay amount assigned by uniformly dividing a total delay amount corresponding to a period T of an input clock signal, that is, the external clock signal ECLK.

For example, by dividing the period T of the external clock signal ECLK by eight, one delay cell delays the external clock signal ECLK by T/8. Accordingly, the signal is delayed by T/8 by passing through one main delay cell, by T/4 by passing through two main delay cells, and by nT/8 by passing through n main delay cells (n is a natural number that is one or greater). As a result, a plurality of reference clock signals are available with different delay amounts.

The phase selection and control unit 130 may comprise phase multiplexer circuits (not shown), and a counter circuit (not shown). The phase selection and control unit 130 determines whether to increase or decrease the delay amount of the main delay chain 110 based on a phase detection signal (CON) from the phase detector 140, and controls the delay amount of the main delay chain 110 according to the determination result. For example, the phase selection and control unit 130 is configured to select two reference clock signals that are the most similar to the external clock signal ECLK from the plurality of reference clock signals that are available using the respective phase multiplexer circuits responsive to the detection signal CON from the phase detector 140. To this end, the phase selection and control unit 130 generates selection control signals D1 and D2. In this exemplary embodiment, the two reference clock signals may be selected by selecting main delay cells that generate the appropriate reference clock signals in response to the selection control signals D1 and D2.

The phase interpolator 120 comprises at least one phase interpolation circuit (not shown). The phase interpolation circuit controls a first clock signal CLK_1 that includes the two reference clock signals selected by the phase selection and control unit 130 and output from the main delay chain 110. The phase interpolation circuit generates a second clock signal CLK_2 with a phase that is between the phases of the two selected reference clock signals.

The additional delay chain 170 delays the second clock signal CLK_2, which is output from the phase interpolator 120. The additional delay chain 170 is used when the main delay chain 110 is replaced or cannot provide a sufficient delay amount. The additional delay chain 170 outputs a third clock signal CLK_3 by delaying the second clock signal CLK_2 received from the phase interpolator 120. In the event that the additional delay provided by the additional delay chain is not required, the second clock signal CLK_2 is output from the additional delay chain 170. The additional delay chain 170 includes a type of delay cells, that is different from the main delay cells (D) used in the main delay chain 110. The additional delay chain 170 has a buffer- or inverter-chain structure, which will be described with reference to FIGS. 4 and 5.

The replica path 150 has the same delay condition as an actual clock path 160, the so-called "tSAC path". The replica path 150 delays the third clock signal CLK_3, which is received from the additional delay chain 170, by a predetermined time according to the actual delay condition and outputs a fourth clock signal CLK_4.

The replica path 150 is a circuit with the same delay condition as the actual clock path 160, which delivers the second clock signal CLK_2 from the phase interpolator 120, or the third clock signal CLK_3 from the additional delay chain 170, to a final data output terminal of the semiconductor memory device (not shown). The replica path 150 is also called a replica circuit.

The fourth clock signal CLK_4 replicated and fed back by the replica path 150 has the same phase as the clock signal delivered to the final data output terminal of the semiconductor memory device (not shown).

The phase detector 140 compares the phase of the fourth clock signal CLK_4 with the phase of the external clock signal ECLK, generates a detection signal CON corresponding to the detected phase difference, and applies it to the phase selection and control unit 130. The phase selection and control unit 130 determines whether to increase or decrease the delay amount of the main delay chain 110 based on the detection signal CON input from the phase detector 140 and controls the delay amount of the main delay chain 110 according to the determination result.

This operation continues to be performed until a dithering phenomenon occurs in the phase detector 140. The third clock signal CLK_3, or the second clock signal CLK_2, generated upon occurrence of the dithering phenomenon becomes an internal clock signal for the semiconductor memory device (not shown), which is then said to be locked.

The additional delay chain control unit 180 controls the delay amount of the additional delay chain 170. When the delay cells in the main delay chain 110 are replaced or cannot provide a sufficient delay, the additional delay chain control unit 180 controls the delay amount of the additional delay chain 170. In normal operation, the delay amount of the additional delay chain 170 is controlled by the additional delay chain control unit 180 or has a default value instead of being controlled by the additional delay chain control unit 180.

The delay locked loop circuit 100 according to an exemplary embodiment of the present invention must be updated periodically or aperiodically. This is because the delay may vary with a variety of conditions, including the operation temperature and the operation voltage and, in such a case, the delay variation must be checked periodically or aperiodically.

The delay locked loop circuit 100 may be updated in response to a CAS before RAS (CBR) signal, which is an internal command of the semiconductor memory device (not shown). In a dynamic random access memory (DRAM), the CBR signal is generated when a column address strobe (CAS) signal is applied earlier than a row address strobe (RAS) signal, and is used for a periodic refresh operation. The reason to use the CBR signal as an update operation initiation signal for the delay locked loop circuit 100 is that, by applying the CBR signal, inputting of data is prohibited.

The main delay cells (D) of the main delay chain 110 and the additional delay chain 170 will be described with reference to FIGS. 3 to 5.

Figure 3:
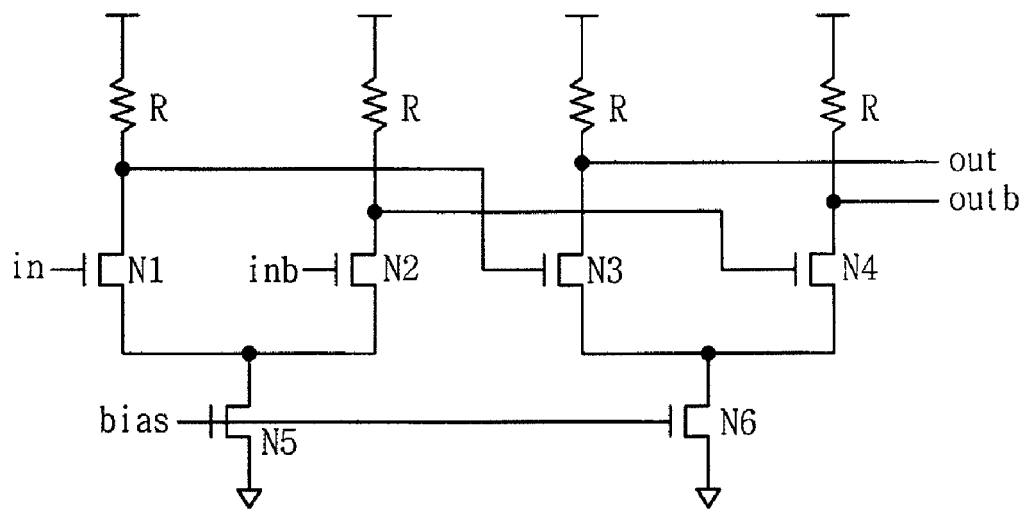
FIG. 3 is a circuit diagram illustrating a main delay cell of the circuit shown in FIG. 2.

FIG. 3 is a circuit diagram illustrating one main delay cell (D) of the main delay chain 110.

The main delay cell of the main delay chain 110 comprises six transistors N1, N2, N3, N4, N5, and N6 and four resistors R connected to transistors N1, N2, N3 and N4, as shown in FIG. 3. The main delay cell of the main delay chain 110 is an analog cell of a differential amplifier type, as well known to those of ordinary skill in the art. The operation of the main delay cell shown in FIG. 3 will be briefly described below.

As shown in FIG. 3, a first input signal in and a second input signal inb, which is an inverted version of the first input signal, are input respectively to gates of the transistors N1 and N2 in the main delay cell. In this example it is assumed that the first signal in is at a high level H and the second signal inb is at a low level L.

In this case, a low level signal is applied to a gate of the transistor N3 and a high level signal is applied to a gate of the transistor N4. Accordingly, the transistor N3 is turned off and the transistor N4 is turned on. An output signal out of the main delay cell becomes at a high level and a corresponding inverted output signal outb becomes at a low level.

As described above, the main delay cell delays an input signal by a predetermined time and outputs a delayed signal. The main delay cell is an analog delay cell that has a large layout area.

Figure 4:
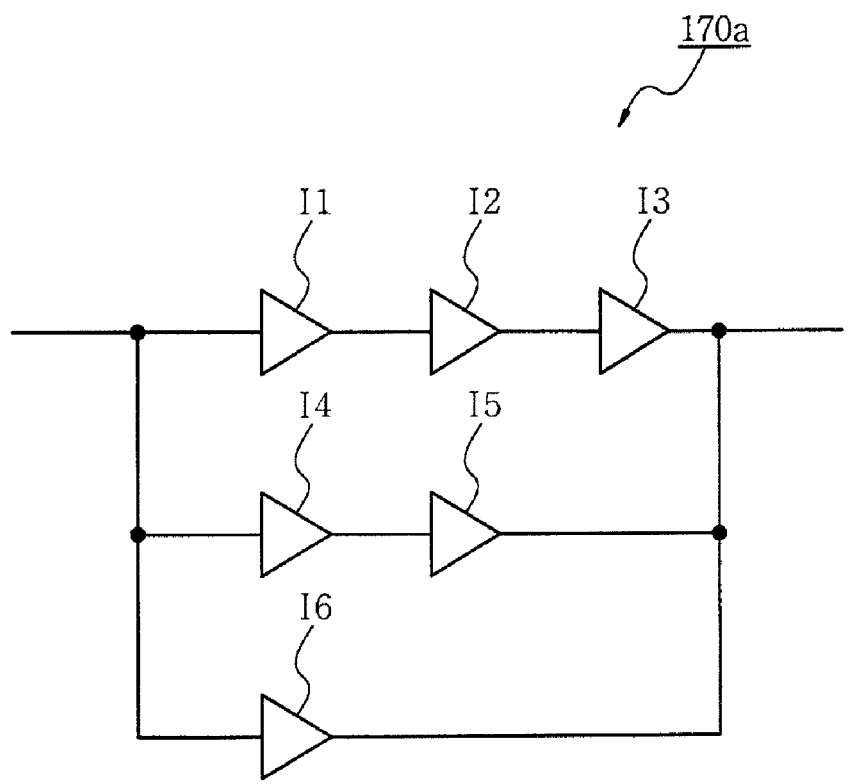
FIGS. 4 and 5 are circuit diagrams illustrating an additional delay chain of the circuit shown in FIG. 2.
Figure 5:
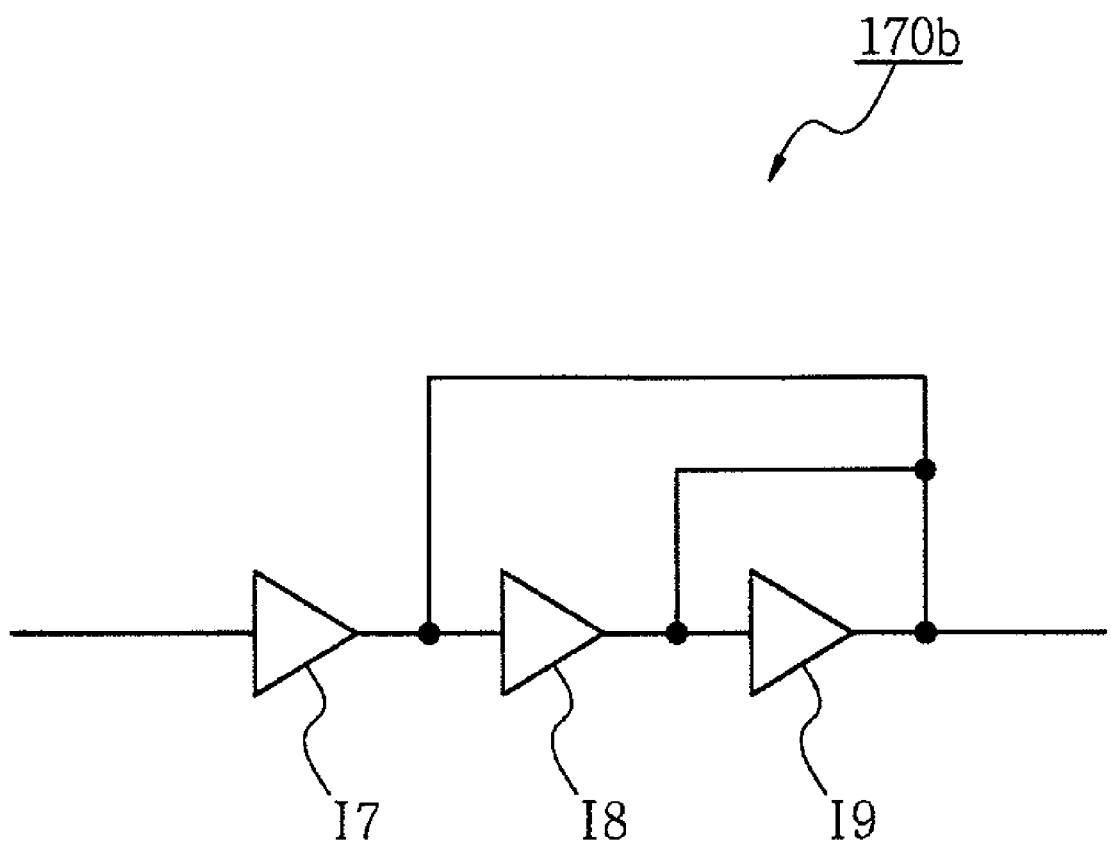

FIGS. 4 and 5 are circuit diagrams illustrating implementations 170a and 170b of the additional delay chain 170 of the circuit shown in FIG. 2.

As shown in FIG. 4, the additional delay chain 170a has a buffer chain structure, unlike the main delay cell of FIG. 3. That is, an additional delay cell is a buffer.

The additional delay chain 170a may comprise a plurality of delay paths, one of which is selected. Specifically, one of a first path including three buffers I1, I2 and I3 connected in series, a second path including two buffers I4 and I5 connected in series, and a third path including one buffer I6 may be selected by the additional delay chain control unit 180 shown in FIG. 2.

Although not shown in FIG. 4, the additional delay chain 170a may further comprise a path including four buffers connected in series, a path including five buffers connected in series, and so on. Selecting one of the available paths is performed by the additional delay chain control unit 180. Although not shown in FIG. 4, the additional delay chain control unit 180 may comprise a multiplexer circuit or a switching circuit.

As shown in FIG. 5, the additional delay chain 170b has a structure in which a plurality of buffers, only three buffers I7, I8 and I9 are shown, are connected in a chain form. The number of buffers employed may increase or decrease depending on the particular need.

The delay amount of the additional delay chain 170b may be determined by selecting any one of the respective outputs of the buffers I7, I8 and I9 using the additional delay chain control unit 180 shown in FIG. 2. For example, when an output of the buffer I7 is selected as the output of the additional delay chain 170b, the input signal is delayed by one buffer. When an output of the buffer I8 is selected as the output of the additional delay chain 170b, the input signal is delayed by two buffers. When an output of the buffer I9 is selected as the output of the additional delay chain 170b, the input signal is delayed by three buffers.

Accordingly, the delay control can be realized by the selection of the buffers in the chain structure of the additional delay chain 170b, like the delay control realized by the selection of the main delay cells in the main delay chain 110.

Although the additional delay chain 170 has been implemented by the buffers shown in FIGS. 4 and 5, it may alternatively be implemented by inverters. To this end, the buffers shown in FIGS. 4 and 5 may be replaced with inverters. In the additional delay chain 170a shown in FIG. 4, the delay paths may include an even number of inverters, and in the additional delay chain 170b shown in FIG. 5, the chain structure may include an even number of inverters. The additional delay chain 170 using the inverters can be easily implemented as described above by those of ordinary skill in the art.

When the additional delay chain 170 has a buffer or inverter structure, a delay cell can be comprised of two transistors as well known in the art. This can reduce layout area and power consumption, unlike the main delay cell shown in FIG. 3. Accordingly, by constituting the main delay chain 110 with a minimal number of main delay cells required for operation and providing the additional delay chain 170 for replacement or compensation, the layout area and power consumption can be greatly reduced.

Operation of the delay locked loop circuit as an operation voltage is changed according to an exemplary embodiment of the present invention will now be described with reference to FIGS. 2 to 5.

First, when the operation voltage changes from a low level to a high level, the delay of the replica path 150 is reduced. To compensate for the delay reduction, the number of delay cells used in the main delay chain 110 is increased. That is, the delay amount is increased.

When the number of main delay cells used in the main delay chain 110 becomes maximum due to continuous level variations, the main delay chain 110 cannot provide any more delay. At this time, the additional delay chain control unit 180 operates. The additional delay chain control unit 180 increases the available delay by connecting the additional delay chain 170 using an internal control logic. A default delay value of the additional delay chain 170 may be set to one half of the total delay amount that can be provided by the additional delay chain 170, but this default delay value may be changed according to the particular need.

For example, when the default value of the additional delay chain 170 is set to the delay amount of the second path including the buffers I4 and I5 shown in FIG. 4 or the delay amount when the output of the buffer I8 of FIG. 5 is selected, the additional delay chain control unit 180 increases the delay of the additional delay chain 170 in a manner that selects the first path including the buffers I1, I2, and I3 of FIG. 4 or the output of the third buffer I9 of FIG. 5. Thus, the logic failure is prevented or minimized even in the face of great operation level variations.

When the operation voltage changes from the high level to the low level, the delay of the replica path 150 increases. To compensate this increase in delay, the number of the main delay cells (D) used in the main delay chain 110 is decreased. Even when the change in the level of the operation voltage causes a delay that is too great to compensate using the main delay cells (D) in the delay chain 110, that is, when the delay cannot be compensated even by minimizing the number of main delay cells used in the main delay chain, the delay compensation by the additional delay chain 170 is initiated.

For example, when the default value of the additional delay chain 170 is set to the delay amount of the second path including the buffers I4 and I5 shown in FIG. 4 or the delay amount of the buffers I7 and I8 when the output of the buffer I8 of FIG. 5 is selected, the additional delay chain control unit 180 reduces the delay of the additional delay chain 170 in a manner that selects the third path including the buffer I6 of FIG. 4 or the output of the buffer I7 of FIG. 5. Thus, the logic failure is prevented and minimized even in the face of great operation voltage level variations.

Figure 6:
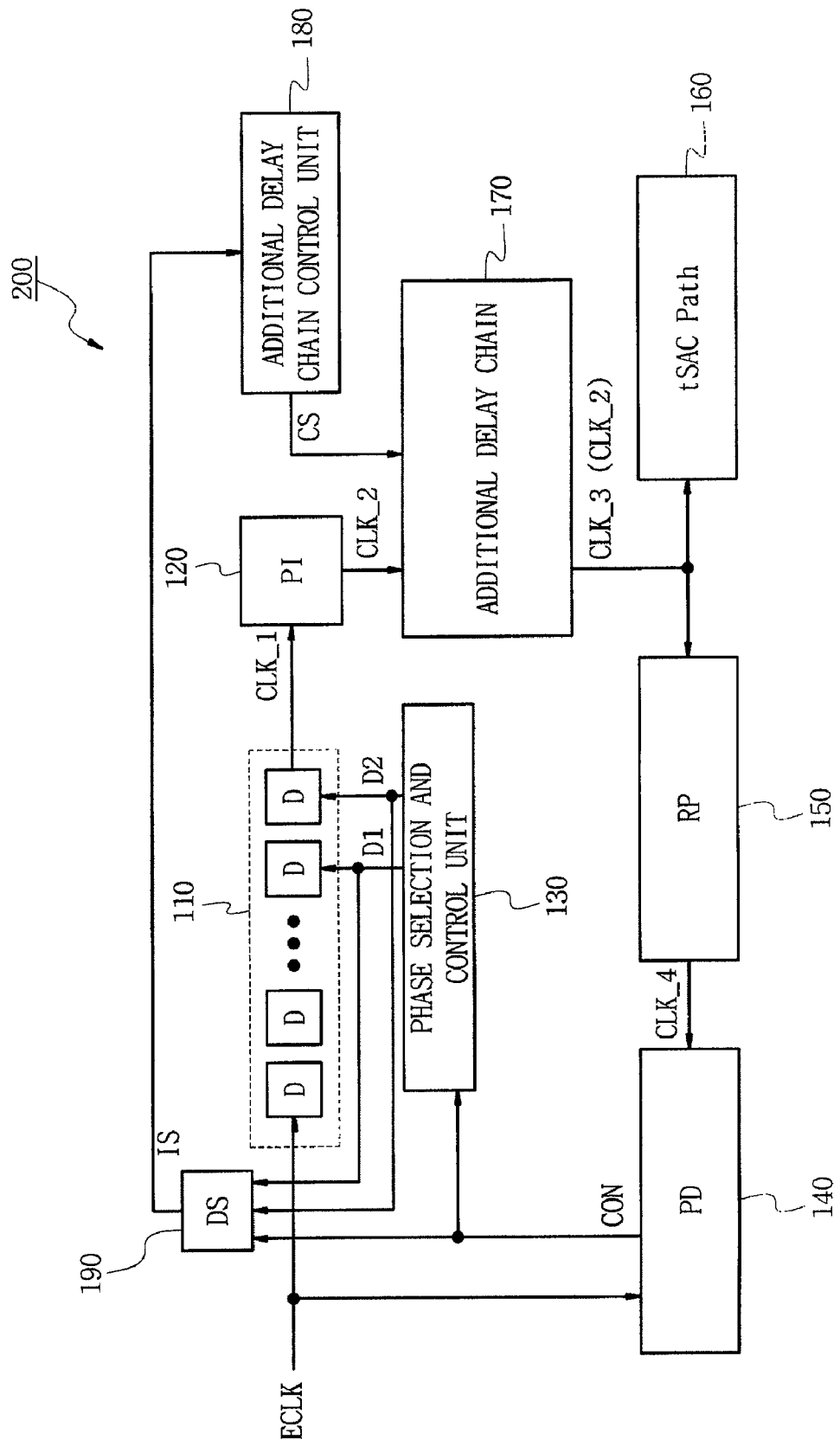
FIG. 6 is a block diagram illustrating a delay locked loop circuit according to an exemplary embodiment of the present invention.

FIG. 6 is a block diagram illustrating a delay locked loop circuit 200 according to an exemplary embodiment of the present invention.

Referring to FIG. 6, the delay locked loop circuit 200 according to an exemplary embodiment of the present invention comprises a main delay chain 110, a phase interpolator (PI) 120, a phase selection and control unit 130, a phase detector (PD) 140, a replica path (RP) 150, an additional delay chain 170, an additional delay chain control unit 180, and a delay sensing unit (DS) 190.

Because the other components except for the delay sensing unit 190 have been described in FIGS. 2 to 5, a detailed description thereof will be omitted and only the delay sensing unit 190 will be described.

The delay sensing unit 190 senses the number of the main delay cells (D) that are in use in the main delay chain 110. For example, the delay sensing unit 190 senses whether the last or first one of the main delay cells in the main delay chain 110 is selected by the phase selection and control unit 130. Also, the delay sensing unit 190 determines whether the detection signal CON generated by the phase detector 140 is for increasing or decreasing the delay.

The delay sensing unit 190 receives the select signals D1 and D2 from the phase selection and control unit 130 and the detection signal CON from the phase detector 140, analyzes the signals to generate a sense signal IS, and sends the sense signal to the additional delay chain control unit 180. For example, when the number of main delay cells used in the main delay chain 110 is maximized by the select signals D1 and D2 generated by the phase selection and control unit 130, and the detection signal CON generated by the phase detector 140 includes information to increase the delay, the delay sensing unit 190 sends a sense signal IS containing information to increase the delay of the additional delay chain 170 to the additional delay chain control unit 180.

When the number of main delay cells used in the main delay chain 110 is minimized by the select signals D1 and D2 generated by the phase selection and control unit 130, and the detection signal CON generated by the phase detector 140 includes information to decrease the delay, the delay sensing unit 190 sends a sense signal IS containing information to decrease the delay of the additional delay chain 170 to the additional delay chain control unit 180.

The sense signal IS is sent to the additional delay chain control unit 180 and in response to the sense signal IS, the additional delay chain control unit 180 performs the delay control operation as described above in relation to FIGS. 2 to 5.

As described above, according to exemplary embodiments of the present invention, the additional delay chain, in addition to the main delay chain, is provided. Thus, the layout area and power consumption can be reduced. Furthermore, the main delay cells can be replaced or compensated and logic failures can be prevented or minimized.

The present invention has been described using exemplary embodiments, however, it is to be understood that the scope of the present invention is not limited to the disclosed exemplary embodiments. On the contrary, the scope of the present invention is intended to include various modifications and alternative arrangements within the capabilities of persons of ordinary skill in the art using presently known or future technologies and equivalents. The scope of the claims, therefore, should be accorded the broadest interpretation so as to encompass all such modifications and similar arrangements.

What is claimed is:

1. A delay locked loop (DLL) circuit comprising:
at least two delay chains having different respective types of delay cells for selectively delaying an external clock signal directly,
wherein the DLL circuit receives the external clock signal and generates an internal clock signal synchronized to the external clock signal, and
wherein one of the delay chains comprises a plurality of main delay cells of a differential amplifier type, and the other delay chain comprises a plurality of additional delay cells of one of an inverter and a buffer type.

2. A delay locked loop (DLL) circuit comprising:
a main delay chain including a plurality of main delay cells of a differential amplifier type for delaying an external clock signal and outputting a first clock signal;
a phase interpolator for interpolating the first clock signal received from the main delay chain and outputting a second clock signal;
an additional delay chain including a plurality of additional delay cells of one of an inverter and a buffer type for additionally adjusting the second clock signal output from the phase interpolator and outputting a third clock signal;
a replica path for delaying the third clock signal output from the additional delay chain by a predetermined time according to a known delay condition and outputting a fourth clock signal, the known delay condition being that of an actual delay path;
a phase detector for comparing a phase of the external clock signal with a phase of the fourth clock signal output from the replica path and outputting a detection signal corresponding to the comparison result; and
a phase selection and control unit for controlling a delay amount of the main delay chain and selecting the main delay cells in response to the detection signal output from the phase detector,
wherein the DLL circuit generates an internal clock signal synchronized to the external clock signal.

3. The circuit according to claim 2, wherein the additional delay chain has one of an inverter chain structure and a buffer chain structure.

4. The circuit according to claim 3, further comprising an additional delay chain control unit for controlling a delay amount of the additional delay chain.

5. The circuit according to claim 4, further comprising a delay sensing unit for sensing use information of the main delay cells in the main delay chain.

6. The circuit according to claim 5, wherein the delay sensing unit receives the detection signal from the phase detector and a main delay cell selection information signal from the phase selection and control unit, and generates a sense signal corresponding to the use information of the main delay cells in the main delay chain.

7. The circuit according to claim 6, wherein the additional delay chain control unit controls the additional delay chain in response to the sense signal from the delay sensing unit.

8. The circuit according to claim 7, wherein the delay locked loop circuit performs an update operation in response to a column address strobe before a row address strobe (CBR) refresh signal.

9. The circuit according to claim 3, wherein the main delay chain has a differential amplifier type chain structure.

10. The circuit according to claim 2, wherein the first clock signal received by the phase interpolator includes two reference clock signals having different phases and the phase interpolator outputs the second clock signal having a phase between the phases of the two reference clock signals.

11. A method for controlling a delay locked loop (DLL) circuit comprising at least two delay chains, the method comprising:
   delaying an external clock signal using a first delay chain of the DLL circuit comprising delay cells of a differential amplifier type to generate an internal clock signal;
   determining whether the internal clock signal has been delayed by a sufficient delay amount;
   adjusting a delay amount using a second delay chain of the DLL circuit comprising cells of an inverter or buffer type by additional delay when the delay amount of the first delay chain is determined to be insufficient; and
   delaying the internal clock signal by the delay amount.

12. The method according to claim 11, wherein the delay locked loop circuit performs an update operation in response to a CBR refresh signal.

* * * * *